United States Patent [19]
Morris et al.

[11] 3,953,802
[45] Apr. 27, 1976

[54] ADJACENT CHANNEL REJECTOR

[75] Inventors: George F. Morris, Pittsford; David L. Babcock, West Henrietta; Eugene A. Peterson, Penfield, all of N.Y.

[73] Assignee: Edmac Associates Inc., East Rochester, N.Y.

[22] Filed: June 6, 1974

[21] Appl. No.: 477,014

[52] U.S. Cl................................ 325/474; 325/324; 325/477; 325/478
[51] Int. Cl.².......................................... H04B 1/10
[58] Field of Search ........... 325/427, 437, 457, 472, 325/473, 474, 477, 322–324, 348, 478, 489

[56] References Cited
UNITED STATES PATENTS

| | | | |
|---|---|---|---|
| 2,951,973 | 9/1960 | Atkinson | 317/147 |
| 2,956,152 | 10/1960 | Rambo | 325/474 |
| 3,218,556 | 11/1965 | Chisholm | 325/303 |
| 3,439,277 | 4/1969 | Schulein | 325/474 |
| 3,462,691 | 8/1969 | McDonald | 325/475 |
| 3,495,244 | 2/1970 | La Rosa | 343/17.1 |
| 3,621,401 | 11/1971 | Young, Jr. | 325/473 |
| 3,665,321 | 5/1972 | Michnik et al. | 325/478 |
| 3,769,591 | 10/1973 | Brown et al. | 325/474 |
| R27,202 | 10/1971 | Kahn | 325/474 |

*Primary Examiner*—Robert L. Griffin
*Assistant Examiner*—Marc E. Bookbinder

[57] ABSTRACT

An adjacent channel rejector for use in communication systems such as TACAN includes a high gain amplifier adapted to be driven into saturation in response to signals in the channel, a wide band filter/demodulator connected to the high gain amplifier and a narrow band filter/demodulator connected to the amplifier. The rejector further includes an amplitude comparator coupled to these filters/demodulators for determining when a desired signal is in the channel thereby providing adjacent channel rejection.

1 Claim, 6 Drawing Figures

3,953,802

ADJACENT CHANNEL REJECTOR

BACKGROUND OF THE INVENTION

1. Field of the Invention

The present invention relates to adjacent channel rejectors for communication systems.

2. Description of the Prior Art

A common problem in radio communication systems such as TACAN and which employs pulse modulation is that there can be interference in the spectrum of signals emitted on a frequency which is near or adjacent to the channel of interest. An example of this problem is illustrated with reference to FIG. 1 which shows a typical spectrum of energy radiated by a pulse transmitter. As shown, the pulse signal on a channel frequency $f2$ necessarily introduces some energy into the channels $f1$ and $f3$. Any receiver attempting to determine whether a desired signal is being transmitted on its channel, say $f3$, will therefore receive energy from a signal present on channel $f2$. There have been some attempts in the past to make receiver channels very selective, but as shown in FIG. 1, this does not reject all the energy from the adjacent channel. Ordinarily, the desired signal on the channel, say $f3$, will be stronger than the residual energy emanated from a pulse signal on the frequency channel $f2$ and no detrimental effects will be noticed. Occasionally, however, the strength of the undesired signal, say on channel $f2$, is much stronger in portions of the channel near the cut-off position than the desired signal. This may happen when trying to receive a signal from a distant transmitter while physically located near a transmitter operating on an adjacent channel. In this case, the residual energy from the undesired signal may be strong enough to cause unacceptable interference with the desired signal. A common type of adjacent channel rejection system used in TACAN, is known as a Ferris discriminator. A Ferris discriminator generally operates in an analog mode and makes comparisons to provide the requisite adjacent channel rejector. A typical Ferris discriminator consists of high and low "Q" input tank circuits, two detecting diodes, and r-f bypass and voltage divider loading networks, two clamping diodes, and two triode amplifiers. The Ferris discriminator receives its input to detect the $i$-$f$ signal and provides adjacent channel and near-adjacent channel rejection.

SUMMARY OF THE INVENTION

It is an object of the present invention to provide an adjacent channel rejector which can make use of digital comparison techniques rather than prior analog Ferris-type discriminators and which is simpler than such prior discriminators but still has a high degree of accuracy.

In the disclosed embodiment of the invention, an adjacent channel rejector includes a high gain amplifier adapted to be driven into saturation when a signal is received in the channel. Coupled to the high gain amplifier is a narrow band filter/demodulator and a wide band filter/demodulator. The outputs of these filter/demodulators is applied to an amplitude comparator which determines if a desired signal is in the channel thereby providing adjacent channel rejection.

Other objects of the invention and its various advantages will become apparent from the ensuing detailed description of the preferred embodiment shown below.

DESCRIPTION OF THE PREFERRED EMBODIMENT

Figure 1:
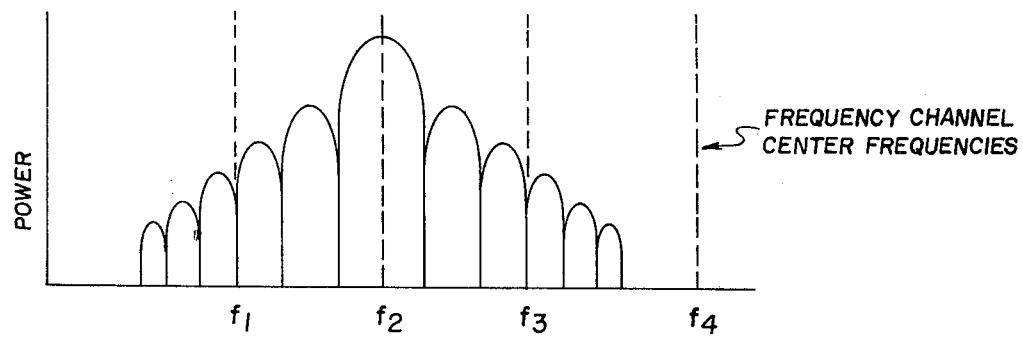
FIG. 1 shows an energy spectrum of a typical signal produced by a pulse transmitter.
Figure 2:
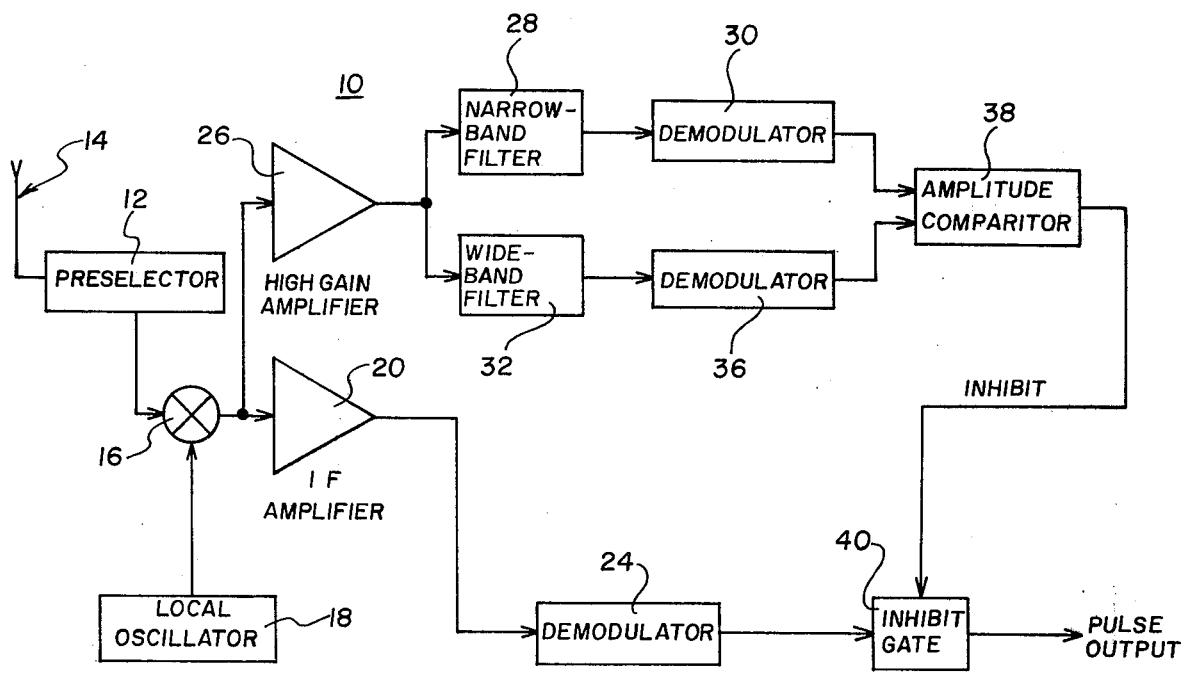
FIG. 2 shows a block diagram of an adjacent channel rejector in accordance with the invention.

Referring now to FIG. 2, a superheterodyne receiver 10 is shown to include a preselector 12 which receives an input via an antenna 14. A mixer 16 receives signals from the preselector 12 and a local oscillator 18 and produces a standard IF frequency signal. An intermediate-frequency amplifier 20 — (which may be a linear amplifier employing automatic or manual gain control, or may be a logarithmic amplifier) — produces an input signal to a demodulator 24, and a high gain amplifier 26. The high gain amplifier 26 must have sufficient gain to produce a large output when the incoming signal is at the threshold of sensitivity of the receiver 10. The noise content of the output of the high gain amplifier may be quite high. Coupled to the amplifier 26 is a narrow band filter 28 connected in series with a demodulator 30. Also coupled to the amplifier is a wide band filter 32 and a demodulator 36. The bandwidth of the high gain amplifier 26 must be at least twice as wide as the spacing separating frequency channels (see $f1$, $f2$, $f3$, or $f4$ shown in FIG. 1). The wide-band filter 32 is also about twice as wide as the spacing between frequency channels. The narrow band filter is preferably between one-fifth, and one-tenth as wide as the wide band filter 32. An amplitude comparator 38 preferably of a type of differential amplifier type, is arranged to receive input from the demodulators 30 and 36 respectively. If the input from the demodulator 30 is greater in amplitude than the input from the demodulator 36, the output of the comparator 38 will be a positive voltage and if it is smaller, the comparator output will be a negative voltage. An inhibit gate 40 is arranged in series with the demodulator 24 and responds to a negative voltage on the comparator output to inhibit the passage of signals produced by the demodulator 24 from further processing by the system.

In operation, pulsed radio frequency signals, having most of their spectrum in the desired frequency, are amplified by the high gain amplifier 26 and applied to the inputs of the two filters 28 and 32 respectively. Since both such filters are centered on the frequency where the major portion of the received energy is concentrated, both filters will have a substantial output, although the wide band filter will have slightly higher output since it captures a larger portion of the total energy. Although not shown, it will be understood that gain controls associated with the filters, or alternately with the demodulators, may be provided to permit the adjustment of the output of the narrow band demodulator 30 to be slightly larger than the output of the wide band demodulator 36 under these conditions. In this situation, the amplitude of the signal produced by the comparator 38 will be a positive voltage thereby permitting the inhibit gate 40 to pass the pulsed signals coming from the IF amplifier 20.

Now if pulsed radio frequency signals are received on the frequency channel adjacent to the desired channel and if these signals are large enough to potentially interfere with the desired receptions (viz have some of their spectrum in the tuned channel) the high gain amplifier 26 is selected to be driven into saturation; that is, its output stages will be driven from full conduction to full cut-off on each cycle of the received radio frequency signal. This condition substantially reduces the instantaneous gain of the amplifier. Under these conditions, the weaker spectral lines of energy which fall within the desired frequency channel will be amplified very little and the narrow band filter 28 output will, therefore, be very small causing the amplitude comparator 38 to operate to inhibit the gate 40, thereby blocking the output of the IF amplifier 20 from going further into the system 10. In this manner, the signal received on the desired frequency channel is passed while blocking a goodly portion of those received on the undesired adjacent channels.

Figure 3A:
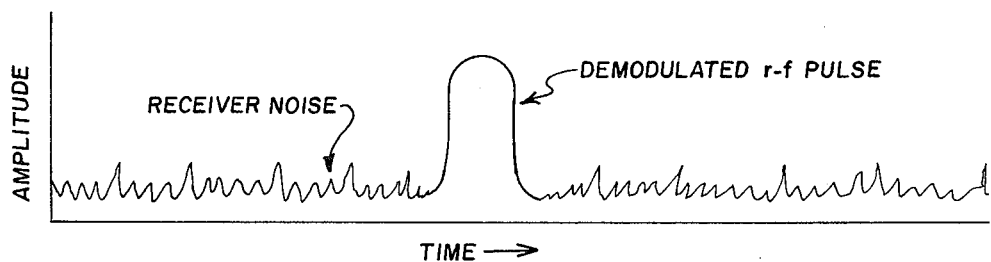
FIG. 3 ($a$–$d$) shows various wave forms produced by the output of the filter/demodulators shown in FIG. 1.
Figure 3B:
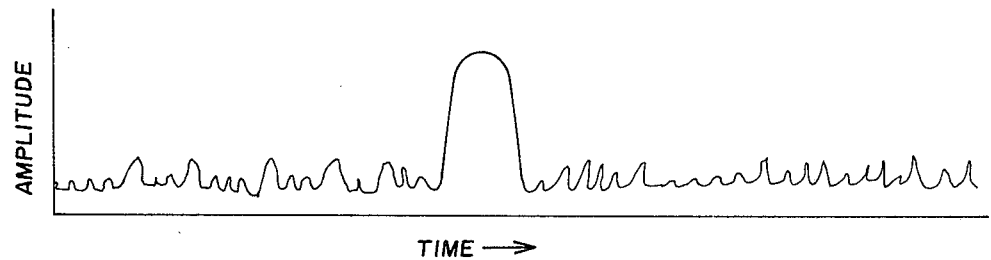
Figure 3C:
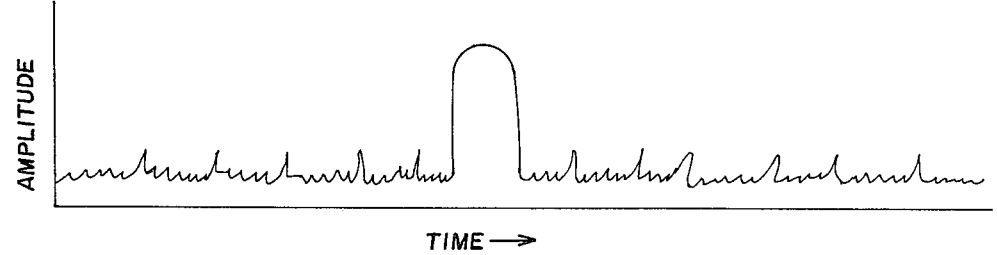
Figure 3D:
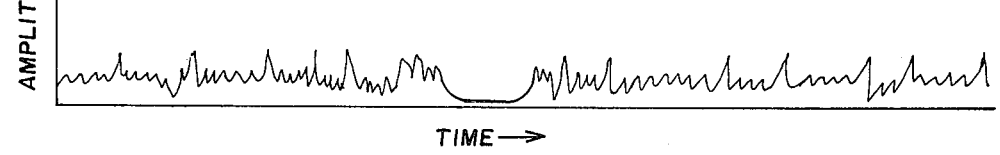

FIG. 3a shows the demodulated output of the wide band filter and FIG. 3b, the demodulated output of the narrow band filter when the received signal is centered on the desired frequency channel, respectively. Notice that there is no significant difference in these two output signals. FIG. 3c shows the demodulated output of the wide band filter 32 and FIG. 3d, the demodulated output of the narrow band filter 28 when the received signal is located on an adjacent channel. Notice that the received signal present at the output of the wide band filter 32 is in an essentially undistorted form because the wide band filter 32 is wide enough to capture signals appearing on the adjacent channel. Notice also that the noise output of the narrow band filter is greatly reduced during the time when the pulse, on an adjacent channel, is present. It is a feature of this invention that this "quieting" is used as a means of determining whether the signal is on an adjacent frequency channel or on the desired frequency channel.

As an alternate approach but, in accordance with the invention, the output of the narrow band filter 28 may be compared relative to a fixed voltage instead of to the output of a wide band filter. In this case, the fixed voltage should be adjusted to be slightly less than the receiver noise level. Then, when a pulse is received on the adjacent channel, the output of the narrow band filter will fall below the preset fixed voltage and the inhibit gate will block the output as explained above.

The invention has been described in considerable detail with particular reference to a preferred embodiment thereof, but it will be undertood that variations and modifications can be effected within the spirit and scope of the invention.

We claim:
1. An adjacent channel rejector for use in a communication system such as a TACAN system, which has a predetermined bandwidth in a channel of interest, for determining if a received signal is either a desired signal or an undesired signal; the desired signal being one which has a center frequency in the determined channel bandwidth, and the undesired signal being one which has a center frequency outside the predetermined channel bandwidth but which introduces significant energy into the predetermined channel bandwidth, comprising:
   a. high gain amplifier means responsive to the desired signal to provide a corresponding amplified output signal and to the undesired signal for being driven into saturation;
   b. a wide band filter connected to said high gain amplifier means and having a bandpass selected to be greater than the predetermined channel bandwidth and for producing a wide band filter output signal in response to either the desired signal or the undesired signal;
   c. a narrow band filter connected to said high gain amplifier means and having a bandpass within the predetermined channel bandwidth; said narrow band filter being responsive to either (1) the undesired signal to produce a narrow band filter output signal which is substantially lower in level than the wide band filter output signal, or (2) the desired signal to produce a narrow band filter output signal which is substantially equal in level to the wide band filter output signal;
   d. comparison means responsive to the energy levels of the output signals of said wide band and said narrow band filters for comparing the said energy levels of the said filter output signals to produce a first signal, when the wide and narrow band filter output signals are substantially equal to thereby indicate that the desired signal is in the channel, and a second signal, when the narrow band filter output signal is substantially lower in level than the wide band output signal to thereby indicate that the undesired signal is in the channel; and
   e. inhibit means coupled to receive said received signal and responsive to said second signal for blocking said received signal and responsive to said first signal for passing said received signal.

* * * * *